United States Patent

Picot

[15] 3,660,834

[45] May 2, 1972

[54] ANALOG CIRCUIT FOR AN ANALOG-TO-DIGITAL CONVERTER OF THE DUAL-SLOPE INTEGRATING TYPE

[72] Inventor: Clément Picot, Massy, France

[73] Assignee: Societe D'Instrumentation Schlumberger, Paris, France

[22] Filed: May 25, 1970

[21] Appl. No.: 40,173

[30] Foreign Application Priority Data

May 28, 1969 France ...............................6917334

[52] U.S. Cl. .......................................340/347 NT, 235/183
[51] Int. Cl. ....................................................H03k 13/20
[58] Field of Search ................240/347; 324/99, 98; 235/183

[56] References Cited

UNITED STATES PATENTS

| | | | |
|---|---|---|---|
| 3,525,093 | 8/1970 | Marshall | 340/347 |
| 3,439,271 | 4/1969 | Metcalf et al. | 340/347 X |

OTHER PUBLICATIONS

C. A. Walton " IBM Technical Disclosure Bulletin" Vol. 11 No. 4 Sept. 1968 pg. 384– 385

*Primary Examiner*—Maynard R. Wilbur
*Assistant Examiner*—Charles D. Miller
*Attorney*—William R. Sherman, Stewart F. Moore and Jerry M. Presson

[57] ABSTRACT

The analog circuit portion of an analog-to-digital converter of the dual-slope integrating type is comprised of a single, high gain differential amplifier having signal inverting and signal noninverting inputs and an integrating capacitor coupling the amplifier output to the inverting input. Analog signal is applied to the noninverting input to charge the capacitor and reference signal is selectively applied to the inverting input to discharge the capacitor. The range of measurement is determined by a resistor having one end connected to the amplifier inverting input and the opposite end connected to a constant potential source.

5 Claims, 2 Drawing Figures

PATENTED MAY 2 1972 3,660,834

INVENTOR.

Clement Picot

BY

J. M. Prisson

ATTORNEY

ANALOG CIRCUIT FOR AN ANALOG-TO-DIGITAL CONVERTER OF THE DUAL-SLOPE INTEGRATING TYPE

The invention relates generally to analog or D.C. signal conversion systems and more particularly to digital voltmeters of the dual-slope integrating type.

A signal conversion system of the so-called dual-slope integrating type is disclosed in U.S. Pat. No. 3,051,939. In this type of converter, an analog input signal, specifically an analog current $I_1$ is applied to an integrator for a fixed time interval $T_1$ to generate a first ramping voltage at the integrator output which departs from a threshold level with a slope which is a function of the magnitude of the current $I_1$. Following the fixed time interval, an appropriately poled reference current $I_2$ is fed to the integrator and integrated thereby to generate a second ramping voltage which, by reason of the direction of reference current flow relative to the integrator, is directed back toward the threshold level. The actual time integrations are performed in what is sometimes referred to by those working in the art as the analog circuit portion of the conversion system. By timing the interval $T_2$ required for the second ramping voltage to attain threshold there is provided a time, and more particularly a digital, representation of the analog signal magnitude.

Known prior art analog circuits employed in this type of converter typically include an operational amplifier with which is associated an input resistor and a negative feedback capacitor. Moreover, the integrator circuit is usually preceded by a buffer or isolation amplifier having a very high input impedance, a very low output impedance and selectable different predetermined gains. By using this type of amplifier properly preconditioned voltages are applied at the input of the integrator regardless of the amplitude of the input signal.

Figure 1:
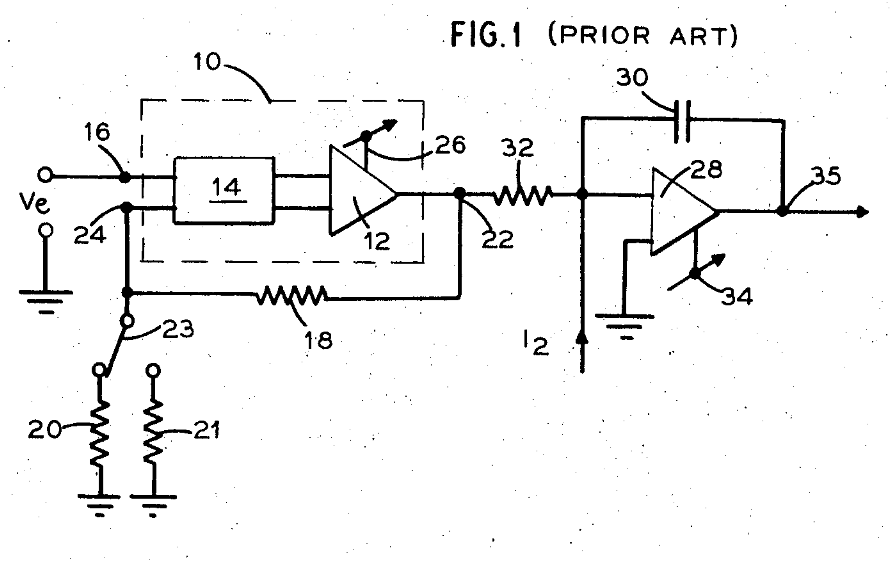
FIG. 1 (PRIOR ART)

By way of example, in FIG. 1, there is depicted a known prior art conversion system of the aforedescribed type. In such a system the buffer amplifier 10 may consist of an amplifier 12 in integrated circuit or monolithic form preceded by a very high impedance differential amplifier input stage 14 comprised, for example, of a pair of interconnected field-effect transistors in the same monolithic form. The use of solid-state integrated circuits has made it possible to considerably simplify and ruggedize the buffer amplifier and integrator-amplifier. The signal to be converted is typically a D.C. voltage $V_e$ applied to the signal noninverting input 16 of the stage 14. A negative feedback potentiometic connection is formed by resistors 18 and 20 between the output 22 of the amplifier 12 and the inverting input 24 of the stage 14. In this way, the source of the voltage $V_e$ to be converted is connected to a practically infinite impedance, the gain G of the buffer amplifier 10 (with polarity inversion) being determined by the attenuation coefficient of the negative feedback potentiometic connection.

The switching of the negative feedback ramp scaling resistors 20 and 21 having different resistance ratios by operation of a suitable switching device 23, permits the selection of preset gains and thereby the choice of the measuring ranges of the converter. In the case where the input signal must be attenuated before being measured, the output of the utilized attenuation circuit is then advantageously connected to one of the high impedance inputs of the buffer amplifier, thereby making it possible to use resistors of high resistance value (and thus limit the current furnished by the source of the signal to be converted). It will be noted that in order to obtain an accurate measurement, any offset voltage $\epsilon$ of the buffer amplifier 12 must be nullified by appropriate adjustment of a zero corrector 26 because otherwise it may introduce an error voltage at the output equal to the gain G times $\epsilon$.

Likewise, a typical prior art integrating amplifier 28 is an operational amplifier in integrated circuit form having an input resistor 32 and an integrating capacitor 30 and additionally, an offset compensating device 34 for reducing any amplifier voltage offset to zero. The resistor 32 and the capacitor 30 form an RC integrator for currents received from the terminal 22.

Thus, in known prior art dual-slope integrating type anglaog-to-digital converters, it is conventional to use for buffering and integrating components, two operational amplifiers, two offset voltage compensation devices, three precision resistors and one integrating capacitor. The inherent characteristics of these different components in large measure determine the performance of the analog circuit and hence the overall performance of the converter. As is usually the case with electronic systems, any reduction in the number of components which can be realized and which neither deleteriously affects the nature nor the accuracy of the system is generally considered advantageous not only with regard to reducing the total cost of components and their verification and fabrication time requirements, but also with regard to the risks of failure and the causes of drift in the system as a whole.

Moreover, it is to be noted that a buffer amplifier placed between the source of the signal to be converted and the integrator may produce conversion errors resulting from the superimposition of A.C. interfering signals (and commonly referred to as "series-mode noise" signals) on the signal to be converted. Such interfering signals are usually at the frequency of the line frequency (60 $H_Z$) and a conventional method of rejecting such signals in the integrator is to make the time interval of analog signal integration equal to an integral number of their cycles of the interfering signal.

It is known that the buffer amplifier, designed to amplify perfectly the direct current to be converted, generally amplifies under less satisfactory conditions A.C. signals which may be superimposed on the D.C. signal under measurement particularly when the peak amplitude of these interfering A.C. signals is considerably higher than that of the D.C. signal and high enough when combined with the D.C. signal to drive the amplifier into saturation.

If the amplifier is in or near saturation with only the D.C. signal applied thereto, then if increased amounts of A.C. signal are applied to the amplifier, the amplifier will clip or rectify the A.C. component with a corresponding reduction in D.C. output. This reduction constitutes an error term in the measurement.

It is an object of this invention to provide a new and improved analog circuit for a signal conversion system of the so-called "dual-slope integrating type."

Another object of the invention is to provide an analog-to-digital converter of the dual-slope integrating type in which, without significant degradation of the general performance of the converter, the means for buffering and integrating an analog input signal is reduced to a minimum number of components.

Still another object of the invention is to provide an analog-to-digital converter of the dual-slope integrating type wherein interfering A.C. input signals do not generate interfering D.C. signals.

According to this invention, there is provided an analog-to-digital converter of the dual-slope integrating type wherein a single operational amplifier having high gain and a very high impedance differential input is employed in lieu of prior art buffer amplifier and integrating amplifier combinations. The analog signal source remains connected to one of the amplifier inputs and specifically the signal noninverting amplifier input during an entire conversion cycle, while an integrating capacitor connects the output of the amplifier to a second one of the amplifier inputs, and specifically the signal inverting amplifier input. The inverting input also receives the reference current upon the selective connection of a suitable reference current source thereto. Gain control of the amplifier may be effected by connecting an appropriate scaling resistor to the inverting input.

By virtue of the instant invention, there is realized an improved input circuit for a converter especially of the type described having an increased reliability, lower temperature drift, absence of source of error resulting from interfering A.C. signals, better long-term stability of gain as a function of temperature, and, importantly a lower manufacturing cost.

For a better understanding of the present invention, together with other and further objects thereof, reference may be had to the following description taken in connection with the accompanying drawings, the scope of the invention being pointed out in the appended claims.

FIG. 1, described hereinabove, depicts a known arrangement for the buffering and integrating circuits of a dual-slope integrating type analog-to-digital converter.

Figure 2:
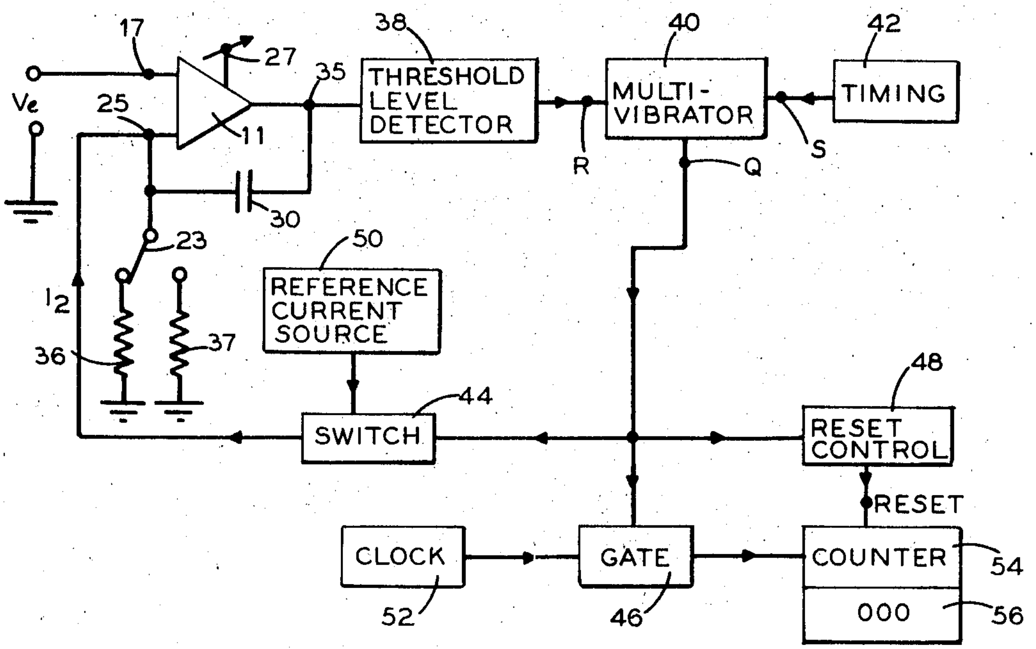

FIG. 2 is an analog-to-digital converter incorporating the buffering and integrating circuits according to the instant invention.

Referring to FIG. 2, the voltage to be converted, $V_e$, is applied to the signal noninverting terminal 17 of a conventional dual input operational amplifier 11. This type of amplifier is often referred to in the art as a "differential amplifier" and characteristically has a very high input impedance and gain and a very low output impedance. The amplifier 11 is also provided with an offset corrector 27 which may be adjusted to obtain zero amplifier offset. Output terminal 35 of the amplifier 11 is connected by way of an integrating capacitor 30 to the signal inverting terminal 25, and thus, a nonregenerative feedback circuit is provided around the amplifier 11.

As will be evident to those working in the art, the voltage at the terminal 25 tends to follow exactly the voltage at the terminal 17 with a voltage magnitude differences therebetween being an inverse function of the amplifier gain G. Because the gain G of operational amplifiers is usually very high, voltage differences between the terminals 17 and 25 tend to be on the order of microvolts. Thus, the voltage at the terminal 25 may be assumed to be of the same magnitude and polarity as the voltage $V_e$. The terminal 25 may be selectively connected through operation of a switching device 23 to gain-scaling resistors 36 and 37 having different suitable values of resistance.

The resistors 36 and 37 are scaled to different, full scale values of the analog voltage $V_e$, and may be selectively connected to the inverting terminal 25 to change the measuring range of the voltmeter. By selecting an appropriate resistance value for each resistor, the voltage developed across the resistor which is then connected to the terminal 25, and more particularly the voltage at the terminal 25 end of the resistor, with a current of full scale magnitude flowing from the terminal 35 through the capacitor 30, is made equal in magnitude and polarity to full scale $V_e$. Obviously, if it is not desired to change the measuring range of the system a continuous connection could be provided between an appropriately valued resistor and the terminal 25.

The terminal 35 is also connected to the input of a threshold level crossing detector 38, the detector 38 being connected to a reset terminal, designated R, of a conventional bistable multivibrator 40. The multivibrator 40 also has a set terminal, designated S, and is triggered from a RESET to a SET state by the application to the terminal S of a voltage from a timing circuit 42. The multivibrator 40 has an output terminal, designated Q, connected to the control terminals of a switch 44 and a gate 46. The switch 44 is placed between a reference current source 50 and the inverting input terminal 25 of the amplifier 11. The gate 46 is placed between a clock 52 delivering timing pulses and a pulse counter 54 associated with a digital display device 56. Further, the output Q of the multivibrator 40 is connected through a reset control circuit 48 to the reset terminal R of the counter 54.

The general operation of the converter of FIG. 2 is described in said U.S. Pat. No. 3,051,939 and hence will be merely briefly reviewed herein.

The multivibrator 40 is triggered into its RESET state when the ramping voltage at the terminal 35 and generated by the reference current $I_2$ equals or crosses the preestablished threshold level for the detector 38, for example, zero volts. At this instant, the gate 46 is also closed and the counter 54 is stopped while the display device 56 indicates the number of pulses just counted. Also at this instant, the switch 44 is opened.

Under these conditions, the voltage $V_e$ applied to the terminal 17 of the integrator generates a charging current $I_1 = V_e/R$ in the capacitor 30 ($R$ being the value of the resistor 36). After a certain period of time, the timing circuit 42 for the period $T_1$ delivers a pulse which triggers the multivibrator 40 to the active state, thereby resetting the counter 54, opening the gate 46 and closing the switch 44. A reference current $I_2$ of the same polarity as the voltage $V_e$, with an amplitude greater than $I_1$, is thus applied to the terminal 25, which discharges the capacitor 30. During this time, the counter 54 counts the pulses delivered by the clock 52. When the signal on the terminal 25 again equals the threshold of the detector 38, the conversion period is terminated. The number displayed at 56 is then representative of $V_e$ (assuming no large variation or transient in $V_e$ has occurred during the few periods immediately preceding that of the present measurement).

In such converters, the very high impedance offered to the voltage $V_e$ is conserved because the fact of constituting an integrating operational amplifier with differential inputs makes it possible to have no negative feedback connection on the input 17 and moreover to use the resistor 36 for completely determining the integration current $I_1 = V_e/R$, thereby making it unnecessary to use the buffering amplifier used heretofore. This permits elimination of an operational amplifier, its compensation device and two precision resistors. Such a simplification is important because it contributes to lowering the cost of production: the reduction in the number of components leading to lower purchasing costs, and shorter verification, assembly and calibrating times. Moreover, it improved the reliability and the performance of the apparatus in general. Furthermore, as the interfering A.C. signals are transmitted directly to the integrating amplifier, no amplitude distortion can be produced and, consequently, no conversion error is realized therefrom.

I claim:

1. In an analog-to-digital conversion system, an amplifier of relatively high gain having signal inverting and signal noninverting input terminals and an output terminal, means for applying an analog signal to the noninverting input continuously during a conversion cycle comprised of successive first and second time intervals of which the first time interval is of fixed duration, a capacitor coupling the amplifier output to the signal inverting input and charging at a rate which is a function of the magnitude of the analog signal applied to said noninverting input during the first time interval, a source of reference current and switch means coupled to said source of current and operable to selectively apply the reference current to said inverting input in a direction to withdraw signal from said capacitor at a substantially constant rate, means for timing the operation of said switch means, means coupled to the timing means for providing a digital representation of the analog signal magnitude, a constant potential source, a plurality of resistors, each resistor having two ends with one end thereof connected to said constant potential source, and a switch for selectively connecting the other ends of said resistors to said inverting terminal, said resistors having different resistance values referenced to different full scale ranges of analog signal magnitude.

2. In an analog-to-digital conversion system, a high gain amplifier D.C. having signal inverting and signal noninverting input terminals and an output terminal, means for applying an analog current to the noninverting input continuously during a conversion cycle comprised of successive first and second time intervals of which the first time interval is of fixed duration, a capacitor coupling the amplifier output to the signal inverting input and charging at a rate proportional to the magnitude of the analog current applied to said noninverting input during the first time interval, a source of reference current having a magnitude greater than the corresponding full scale magnitude of analog current and poled in a direction to discharge said capacitor, switch means coupled to said source of current and operable to selectively apply the reference current to said inverting input in a direction to discharge said capacitor at a substantially constant rate which is also a function of the applied analog current magnitude, means for timing the operation of said switch, means coupled to the timing means for providing a digital representation of the analog signal magnitude, a constant potential source, a plurality of range-determining resistors, each resistor having two ends with one end thereof connected to said constant potential source, said resistors having different resistance values referenced to different desired full scale ranges of analog current and a range-changing switch for selectively connecting different ones of the other ends of said resistors to said inverting terminal to change the measuring range of said system.

3. The system as claimed in claim 2 wherein the potential level of said constant potential source is lower than the normal voltage at said one end of each resistor.

4. The system as claimed in claim 3 wherein said potential level is zero volts.

5. The system as claimed in claim 2 wherein said constant potential source is ground.

* * * * *